US008914755B1

(12) United States Patent
Hsu et al.

(10) Patent No.: US 8,914,755 B1
(45) Date of Patent: Dec. 16, 2014

(54) LAYOUT RE-DECOMPOSITION FOR MULTIPLE PATTERNING LAYOUTS

(71) Applicant: Taiwan Semiconductor Manufacturing Company Limited, Hsin-Chu (TW)

(72) Inventors: Chin-Hsiung Hsu, Guanyin Township (TW); Huang-Yu Chen, Zhudong Township (TW); Yuan-Te Hou, Hsinchu (TW); Yen-Pin Chen, Taipei (TW); Wen-Hao Chen, Hsin-Chu (TW); Chung-Hsing Wang, Baoshan Township (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/903,838

(22) Filed: May 28, 2013

(51) Int. Cl.
G06F 17/50 (2006.01)
(52) U.S. Cl.
CPC .................. *G06F 17/5072* (2013.01)
USPC ........................................................... 716/55
(58) Field of Classification Search
CPC ........ G06F 17/5068; G03F 1/144; G03F 1/36
USPC .................................................... 716/50–56
See application file for complete search history.

(56) References Cited

U.S. PATENT DOCUMENTS

| | | | | |
|---|---|---|---|---|
| 6,799,307 B1 * | 9/2004 | Lipton et al. | .................. | 716/112 |
| 6,988,253 B1 * | 1/2006 | Lipton et al. | .................. | 716/112 |
| 7,814,443 B2 * | 10/2010 | Finkler et al. | .................. | 716/100 |
| 7,856,613 B1 * | 12/2010 | Weling et al. | .................... | 716/55 |
| 7,913,197 B1 * | 3/2011 | Kruger et al. | .................... | 716/53 |
| 7,934,177 B2 * | 4/2011 | Shin et al. | ........................ | 716/55 |
| 8,141,007 B2 * | 3/2012 | Sinha et al. | ...................... | 716/54 |
| 8,234,599 B2 * | 7/2012 | Sahouria et al. | ................ | 716/55 |
| 8,312,394 B2 * | 11/2012 | Ban et al. | ......................... | 716/50 |
| 8,359,556 B1 * | 1/2013 | Abou Ghaida et al. | ......... | 716/54 |
| 8,370,788 B2 * | 2/2013 | Lo et al. | ......................... | 716/136 |
| 8,392,870 B2 * | 3/2013 | Zhang et al. | .................. | 716/138 |
| 8,402,396 B2 * | 3/2013 | Kahng et al. | ..................... | 716/52 |
| 8,516,403 B2 * | 8/2013 | Abou Ghaida et al. | ......... | 716/52 |
| 8,645,902 B1 * | 2/2014 | Yu et al. | ........................ | 716/139 |
| 8,647,893 B1 * | 2/2014 | Agarwal et al. | ................ | 438/16 |
| 8,689,151 B1 * | 4/2014 | Agarwal et al. | ................ | 716/55 |
| 2004/0049757 A1 * | 3/2004 | Vidhani | ......................... | 716/12 |
| 2004/0068712 A1 * | 4/2004 | Heng et al. | ...................... | 716/21 |
| 2008/0189672 A1 * | 8/2008 | Shin et al. | ....................... | 716/19 |
| 2009/0070732 A1 * | 3/2009 | Sahouria et al. | ................ | 716/20 |
| 2010/0229145 A1 * | 9/2010 | Sahouria et al. | ................ | 716/19 |
| 2011/0004858 A1 * | 1/2011 | Chang et al. | ................... | 716/122 |
| 2011/0078638 A1 * | 3/2011 | Kahng et al. | ..................... | 716/52 |
| 2012/0102442 A1 * | 4/2012 | Ghan et al. | ...................... | 716/55 |

(Continued)

*Primary Examiner* — Stacy Whitmore
(74) *Attorney, Agent, or Firm* — Cooper Legal Group, LLC

(57) ABSTRACT

Among other things, one or more techniques and systems for layout re-decomposition of a new layout corresponding to a change order to an original layout associated with an integrated circuit are provided. The change order is applied to the original layout to create the new layout. The original layout comprises one or more original pattern portions assigned pattern colors that correspond to pattern masks. One or more new pattern portions within the new layout are assigned pattern colors such that the new layout has a relatively high color similarity with respect to the original layout. In this way, changes to the pattern masks are reduced, thus mitigating fabrication delay or costs that would otherwise result from significant changes to the pattern masks.

20 Claims, 10 Drawing Sheets

(56) References Cited

U.S. PATENT DOCUMENTS

| | | | |
|---|---|---|---|
| 2012/0196230 A1* | 8/2012 | Cho et al. | 430/319 |
| 2013/0061185 A1* | 3/2013 | Abou Ghaida et al. | 716/55 |
| 2013/0094035 A1* | 4/2013 | Chang et al. | 358/1.9 |
| 2013/0159945 A1* | 6/2013 | Kahng et al. | 716/52 |
| 2013/0339911 A1* | 12/2013 | Hsu et al. | 716/55 |
| 2014/0007026 A1* | 1/2014 | Chen et al. | 716/55 |
| 2014/0035151 A1* | 2/2014 | Yuan et al. | 257/773 |
| 2014/0038085 A1* | 2/2014 | Chern et al. | 430/5 |
| 2014/0053118 A1* | 2/2014 | Chen et al. | 716/52 |
| 2014/0059504 A1* | 2/2014 | Chen et al. | 716/55 |
| 2014/0068531 A1* | 3/2014 | Chen et al. | 716/55 |

* cited by examiner

LAYOUT RE-DECOMPOSITION FOR MULTIPLE PATTERNING LAYOUTS

BACKGROUND

Electronic design tools allow designers to layout, simulate, and analyze integrated circuits. For example, an application-specific integrated circuit design flow comprises a logic synthesis phase, a component placement phase, a routing phase for interconnecting components, a layout extraction phase, timing verification, etc. Due to the relatively small size of integrated circuits, various physical constraints, such as size constraints, spacing constraints, or other constraints, can restrict design layout of integrated circuits. To overcome some of these issues, multiple pattern masks are created for separately fabricating components onto an integrated circuit. For example, a multiple-patterning layout comprises a first pattern mask used to fabricate a first set of components onto the integrated circuit. The multiple-patterning layout comprises a second pattern mask used to fabricate a second set of components onto the integrated circuit. In this way, one or more components within the first set of components can be placed relatively close to one or more components within the second set of components without being limited by physical spacing constraints between components of a single pattern mask. A change order, such as an engineering change order, can be used to modify the design layout for the integrated circuit before creation of the pattern masks or after creation of the pattern masks. The change order can result in relatively significant pattern mask changes where components are reassigned from a pattern mask to a different pattern mask, thus causing fabrication delays or other issues.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

One or more techniques and systems for layout re-decomposition are provided herein. That is, an original layout comprises a design layout for an integrated circuit (e.g., before a change order). The original layout can be decomposed into one or more pattern masks by assigning pattern portions to respective pattern masks. In this way, the one or more pattern masks are physically created and used during fabrication to form one or more components, such as wires, transistors, logic cells, or other components, on the integrated circuit. A pattern color corresponds to an identifier used to associate a pattern portion, such as a polygon representing a component of the integrated circuit or portion thereof, with a particular pattern mask. For example, a first pattern color is assigned to one or more first polygons to be formed using a first pattern mask; a second pattern color is assigned to one or more second polygons to be formed using a second pattern mask; etc. In this way, the integrated circuit is fabricated through a multiple-patterning layout process. A change order, such as an engineering change order, can be specified for the original layout. The change order is used to modify the design layout of the integrated circuit. For example, the change order is used to insert logic changes into a netlist associated with the original layout. Before physical fabrication of pattern masks, the change order can be used to make changes by applying incremental change operations that can mitigate time consumption by avoiding a full application-specific integrated circuit design flow. After physical fabrication of pattern masks, the change order can be used to reduce costs by utilizing unused logic gates within the original layout, which can reduce an amount of pattern mask changes.

As provided herein, layout re-decomposition assigns pattern colors to a new layout (e.g., corresponding to a change order to an original layout) such that the new layout has relatively high color similarity with respect to the original layout. The relatively high color similarity reduces the amount of pattern mask changes, which can mitigate cost or delay during fabrication from the change order. In particular, a pattern layout correlation between the original layout and the new layout is defined. Because the change order can add, remove, or modify pattern portions to the original layout, the pattern layout correlation provides an indication of variations between the original and the new layout. A relatively high pattern layout correlation indicates little variation between the original layout and the new layout. A relatively low pattern layout correlation indicates that a greater variation between the original layout and the new layout.

Pattern color similarity is defined between the original layout and the new layout. Because it is advantageous to increase color similarity between the original layout and the new layout (e.g., increased color similarity results in less pattern mask changes, which can reduce costs or delay during fabrication that would otherwise occur from such changes), pattern color similarity is taken into account when assigning pattern colors to new pattern portions within the new layout. In this way, pattern colors are assigned in a color similarity aware manner to the new layout based upon the pattern layout correlation and the pattern color similarity.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1:
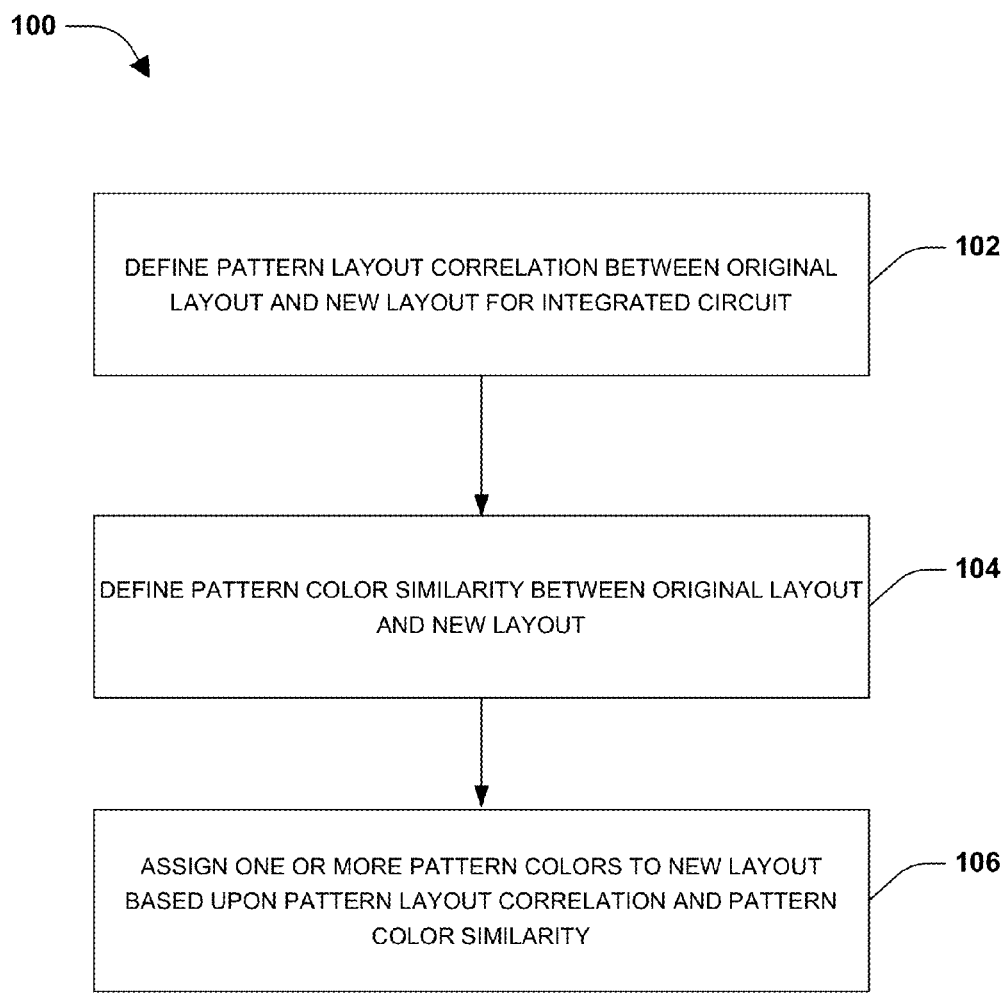
FIG. 1 is a flow diagram illustrating a method of layout re-decomposition, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

A method 100 of layout re-decomposition, according to some embodiments, is illustrated in FIG. 1. An original layout corresponds to a design layout for an integrated circuit, such as a multiple-patterning layout or a self-aligned multiple-patterning layout. The original layout comprises one or more original pattern portions, such as polygons representing wires, devices, or other components, that are decomposed (e.g., "colored") into one or more pattern masks. For example, a first pattern color is assigned to a first set of original pattern portions to be formed by a first pattern mask; a second pattern color is assigned to a second set of original pattern portions to be formed by a second pattern mask; etc. The change order is used to modify the original layout. For example, the change order can add, remove, or modify pattern portions from the original layout to create the new layout. In some embodiments, even a relatively minor change order can result is a relatively extensive change to pattern color assignments. Such changes to pattern color assignments can result in significant pattern mask changes, and thus result in additional fabrication costs or delays. For example, an addition of a single pattern portion can result in numerous pattern portions being re-assigned to a different pattern color during decomposition of the new layout. Accordingly, as provided herein, the new layout is decomposed, such as assigned pattern colors, in a manner that increases color similarity between the original layout and the new layout. The change order can be implemented before mask creation of pattern masks or after mask creation of the pattern masks.

At 102, a pattern layout correlation is defined between the original layout and the new layout. In some embodiments, a first pattern layout correlation is calculated based upon an overlapping area factor. The overlapping area factor corresponds to a positional correlation of an original pattern portion within the original layout and a new pattern portion within the new layout. For example, the first pattern layout correlation indicates a relatively high correlation between the original pattern portion and the new pattern portion where such portions occupy similar areas or have similar positions. In an example, the overlapping area factor is defined by:

$$\frac{\text{overlapping area}}{\text{pattern area}}.$$

In some embodiments, a first pattern layout correlation is calculated based upon a surrounding pattern factor. The surrounding pattern factor corresponds to a relationship between a projected length, a pattern edge length, or other positional/measurement information associated with a pattern portion. In an example, the surrounding pattern factor is defined by:

$$\frac{\text{projected length}}{\text{pattern edge length}}.$$

The surrounding pattern factor can indicate RC coupling, timing information, or other relationship information between the pattern portion and surrounding pattern portions. In some embodiments, a first pattern layout correlation is calculated based upon an overlapping area factor and a surrounding pattern factor, which is defined by:

$$\frac{\left(\frac{\text{overlapping area}}{\text{pattern area}} + \frac{\text{projected length}}{\text{pattern edge length}}\right)}{2}.$$

In some embodiments, a new pattern portion has more than one pattern layout correlation because the new pattern portion has at least some correspondence with multiple original pattern portions. Accordingly, the pattern layout correlations are evaluated against a correlation threshold (e.g., a highest correlation is selected) in order to identify an original pattern portion as correlated to the new pattern portion. In this way, pattern layout correlation is defined in order to identify which new pattern portions are correlated with original pattern portions (e.g., pattern portions unaffected by the change order) and which new pattern portions are not correlated with original pattern portions (e.g., newly added pattern portions by the change order).

At 104, pattern color similarity is defined between the original layout and the new layout. The pattern color similarity is used to determine how to assign pattern colors to new pattern portions within the new layout such that the new layout has a relatively similar color assignment with respect to the original layout, thus mitigating pattern mask changes. In some embodiments, a bipartite graph is generated for defining the pattern color similarity. The bipartite graph comprises a first set of nodes representing new pattern portions within the new layout. For example, a first node within the first set of nodes represents a first new pattern portion. The bipartite graph comprises a second set of nodes representing original pattern portions within the original layout. For example, a first node within the second set of nodes represent a first original pattern portion. A bipartite matching technique is used to match respective nodes within the first set of nodes to respective nodes within the second set of nodes based upon pattern similarity as defined by the pattern layout correlation. In an example, respective nodes within the first set of nodes, representing new pattern portions, are connected to one or more nodes within the second set of nodes, representing original pattern portions, utilizing one or more edges. For example, a first edge connects a first node representing a first new pattern portion and a second node representing a first original pattern portion. The first edge generally comprises a cost metric. The cost metric corresponds to a difference in pattern color between the first original pattern portion and a potential color pattern for the first new pattern portion.

In some embodiments, pattern color similarity is defined as $Sc = \Sigma - Rij \cdot |ci-cj|$ where $Sc$ is pattern color similarity between the original layout and the new layout, $c_i$ is a "potential" pattern color for a new pattern portion within the new layout, $c_j$ is a pattern color of an original pattern portion within the original layout, $R_{ij}$ is pattern layout correlation between the new pattern portion and the original pattern portion, and $c_i$-$c_j$ is a cost to assign $c_i$ to the new pattern portion. In an example, a cost of 0 is assigned when there is no color difference between the pattern color of the original pattern portion and the potential pattern color for the new pattern. In another example, a cost greater than 0 is assigned where there is a different in pattern color.

In some embodiments, a network flow is generated based upon the bipartite graph. The network flow is utilized to assign one or more pattern colors to the new layout. For example, the network flow is evaluated according to a max flow approach such that edges within the network flow are traversed in a manner that reduces color dissimilarity between the original layout and the new layout (e.g., traversing least cost edges). It is appreciated that a variety of techniques, other than bipartite graphs or network flows, can be used to identify similarity in color between the original layout and the new layout.

At 106, one or more pattern colors are assigned to the new layout based upon the pattern layout correlation and the pattern color similarity, such as by evaluating the bipartite graph or the network flow. For example, a first pattern color is assigned to a first set of new pattern portions such that the first set of new pattern portions are assigned to a first pattern mask; a second pattern color is assigned to a second set of new pattern portions such that the second set of new pattern portions are assigned to a second pattern mask; etc. In some embodiments, the first pattern color, but not the second pattern color, is assigned to a first new pattern portion based upon the assignment of the first pattern color resulting in an increased layout coloring similarity for the new layout with respect to the original layout.

In some embodiments, a conflict graph is constructed. The conflict graph is used to identify pattern portions that are too close to one another such that the pattern portions cannot be fabricated using a single mask due to limitations associated with optical lithography. Accordingly, if first and second pattern portions are too close to one another (e.g., violate a threshold spacing distance requirement) then the first pattern portion is fabricated using a first mask while the second pattern portion is fabricated using a second pattern mask. Accordingly, in the conflict graph, an edge is inserted between a first node representing the first pattern portion and a second node representing the second pattern portion, where the edge indicates that the first node and the second node cannot be assigned to the same pattern mask. Once edges are inserted into the conflict graph, pattern groups, not connected by edge, are identified and colors are assigned to such pattern groups based upon costs. In an example, the conflict graph is indicative of coloring assignments that would result in a conflict such as a violation of a size constraint, spacing constraint, or other constraint. A set of pattern groups within the new layout are identified based upon the conflict graph. For example, a first pattern group comprises one or more pattern portions within a threshold distance of one another without resulting in a conflict. For respective pattern groups within the set of pattern groups, costs are assigned to potential color schemes for a current pattern group. A potential color scheme, having a cost below a cost threshold, is selected as an assignment color scheme comprising one or more pattern colors for assignment to respective new pattern portions within the current pattern group. In this way, one or more pattern colors are assigned to the new layout in a manner that increases color similarity between the new layout and the original layout, which can mitigate pattern mask changes that would otherwise result in fabrication cost increases or delays.

Figure 2:
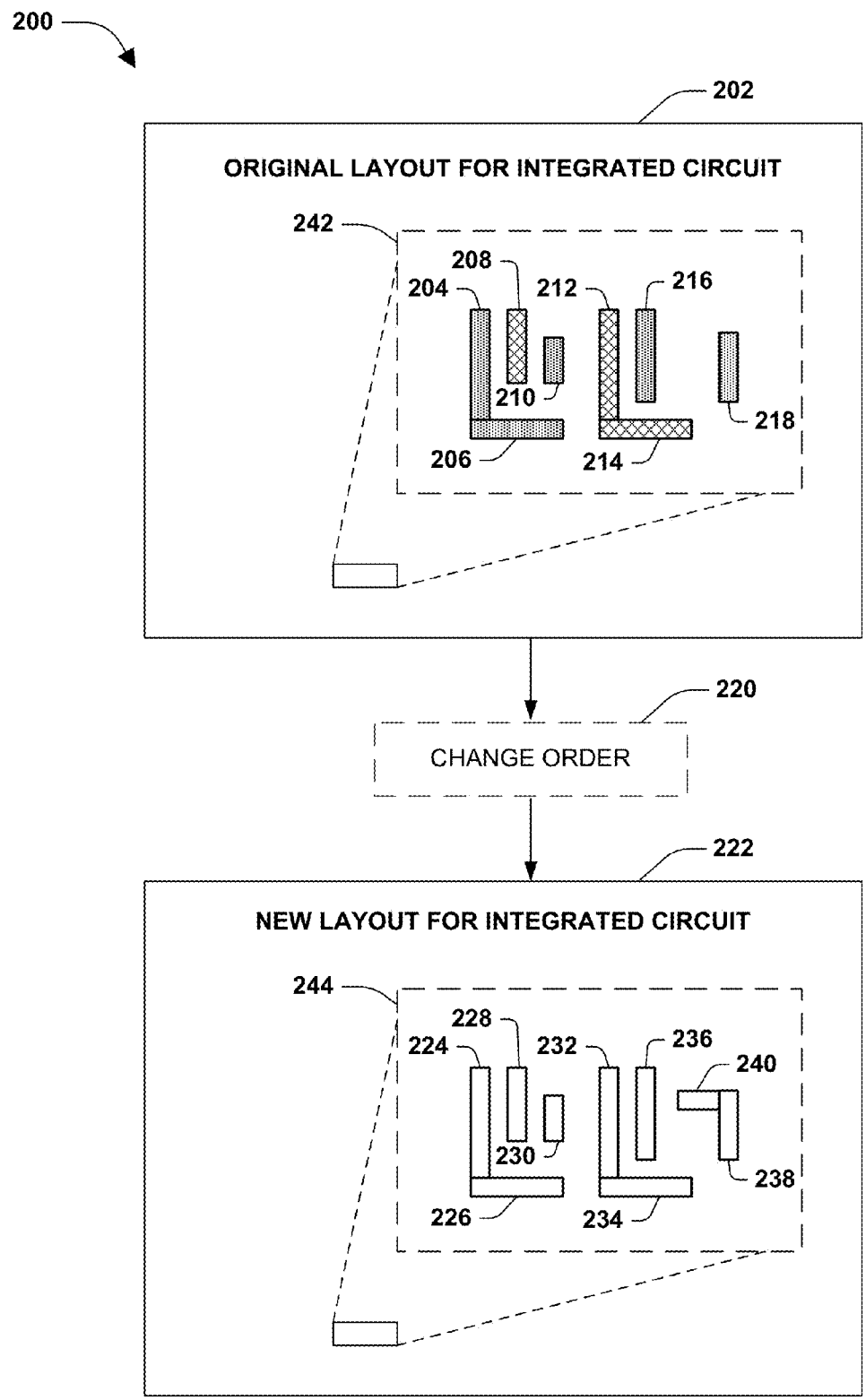
FIG. 2 is an illustration of a change order for an original layout associated with an integrated circuit, according to some embodiments.

FIG. 2 illustrates a change order 220 for an original layout 202 associated with an integrated circuit, according to some embodiments. The original layout 202 comprises one or more original pattern portions. For example, a first region 242 of the original layout 202 comprises a first original pattern portion 204, a second original pattern portion 206, a third original pattern portion 208, a fourth original pattern portion 210, a fifth original pattern portion 212, a sixth original pattern portion 214, a seventh original pattern portion 216, and an eighth original pattern portion 218. The first original pattern portion 204, the second original pattern portion 206, the fourth original pattern portion 210, the seventh original pattern portion 216, and the eighth original pattern portion 218 are assigned to a first pattern color used to identify such original pattern portions for fabrication by a first pattern mask. The third original pattern portion 208, the fifth original pattern portion 212, and the seventh original pattern portion 214 are assigned to a second pattern color used to identify such original pattern portions for fabrication by a second pattern mask. It is appreciated that merely two pattern colors are illustrated for simplicity, and that other pattern colors can be used.

In an example, the change order 202 modifies the first region 242 by inserting a new pattern portion, such as a ninth new pattern portion 240, into the original layout 202 to create a new first region 244 within a new layout 222. The new first region 244 comprises a first new pattern portion 224, a second new pattern portion 226, a third new pattern portion 228, a fourth new pattern portion 230, a fifth original new portion 232, a sixth new pattern portion 234, a seventh new pattern portion 236, an eighth new pattern portion 238, and the ninth new pattern portion 240. As provided herein, one or more pattern colors are assigned to new pattern portions within the new layout 222 in a manner that increases color similarity between the new layout 222 and the original layout 202. Such color similarity can mitigate pattern mask changes that can otherwise result in fabrication delays or increased costs.

Figure 3:
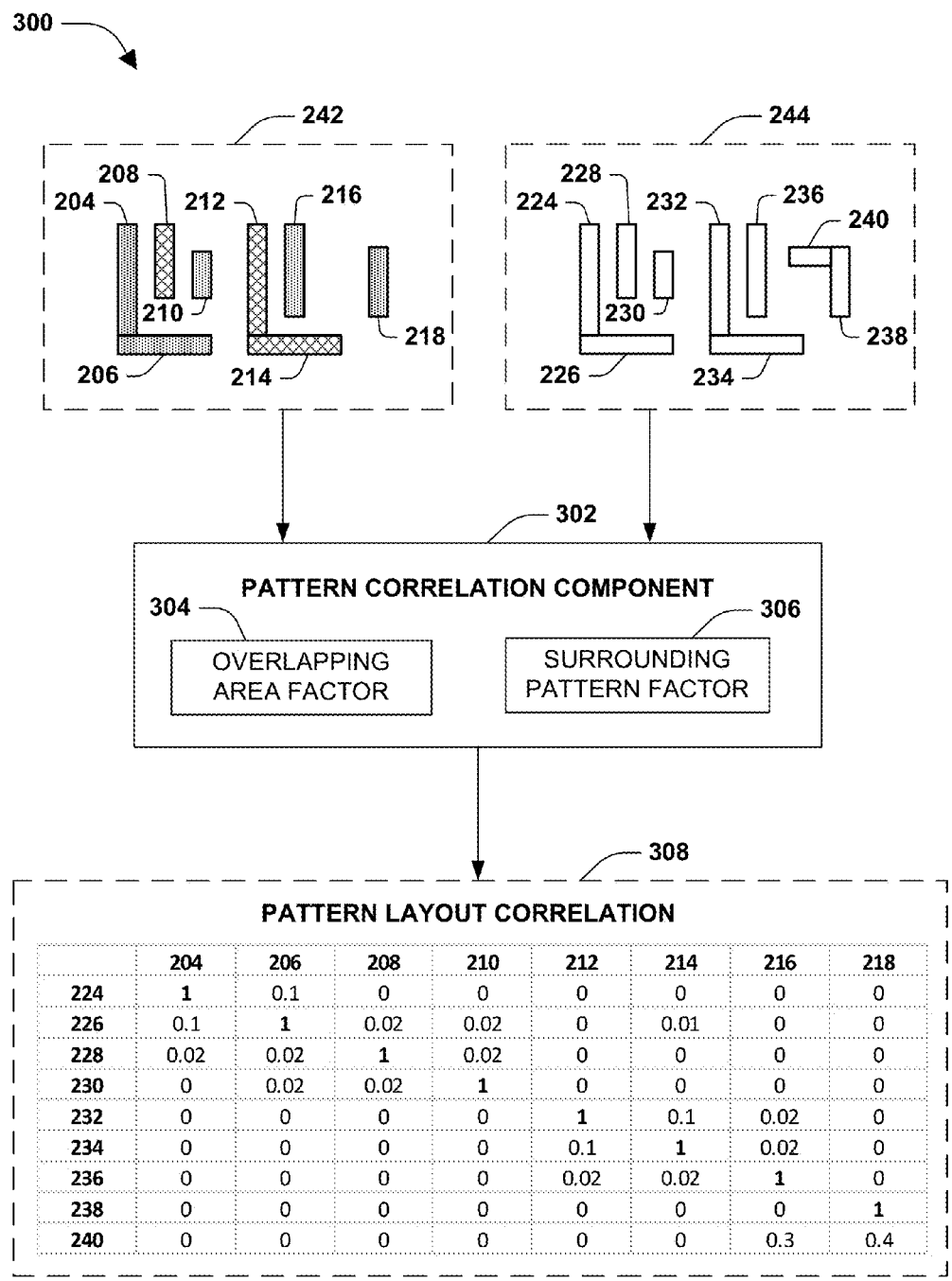
FIG. 3 is an illustration of a system configured for defining a pattern layout correlation between an original layout and a new layout, according to some embodiments.

FIG. 3 illustrates a system 330 for defining a pattern layout correlation 308 between the original layout 202 and the new layout 222, according to some embodiments. The system 300 comprises a pattern correlation component 302. The pattern correlation component 302 is configured to define the pattern layout correlation 308 based upon an overlapping area factor 304 and a surrounding pattern factor 306. Because the new layout 222 corresponds to a modified version of the original layout 202 by the change order 220, correlations between new pattern portions and original pattern portions are initially unknown due to the modification by the change order 220. Accordingly, the pattern correlation component 302 can determine which original pattern portions correspond to new pattern portions (e.g., original pattern portions not removed or significant modified by the change order 220) and which new pattern portions do not correspond to original pattern portions (e.g., a new pattern portion newly added by the change order 220).

In an example, the pattern correlation component 302 determines that there are relatively high correlations (e.g., a correlation of 1 indicating a one-to-one matching) between the first original pattern portion 204 and the first new pattern portion 224, the second original pattern portion 206 and the second new pattern portion 226, the third original pattern portion 208 and the third new pattern portion 228, the fourth original pattern portion 210 and the fourth new pattern portion 230, the fifth original pattern portion 212 and the fifth new pattern portion 232, the sixth original pattern portion 214 and the sixth new pattern portion 234, the seventh original pattern portion 216 and the seventh new pattern portion 236, and the eighth original pattern portion 218 and the eighth new pattern portion 238. For example, the overlapping area factor 304 indicates that such correlation pairs share similar positions between the original layout 202 and the new layout 222. In another example, the pattern correlation component 302 determines that there are relatively moderate correlations (e.g., a correlation of 0.3 or 0.4) between the seventh original pattern portion 216 and the ninth new pattern portion 240 and between the eighth original pattern portion 218 and the ninth new pattern portion 240. In another example, the pattern correlation component 302 determines that there are relatively low correlations (e.g., a correlation of 0.2 or below) between remaining correlation pairs. For example, the first original pattern portion 204 has a negligible correlation of 0.1 with respect to the second pattern portion 226 based upon a relatively low positional proximity. In this way, the pattern correlation component 302 defines the pattern layout correlation 308. The pattern layout correlation 308 can be evaluated to determine which original pattern portions and new pattern portions are correlated.

Figure 4:
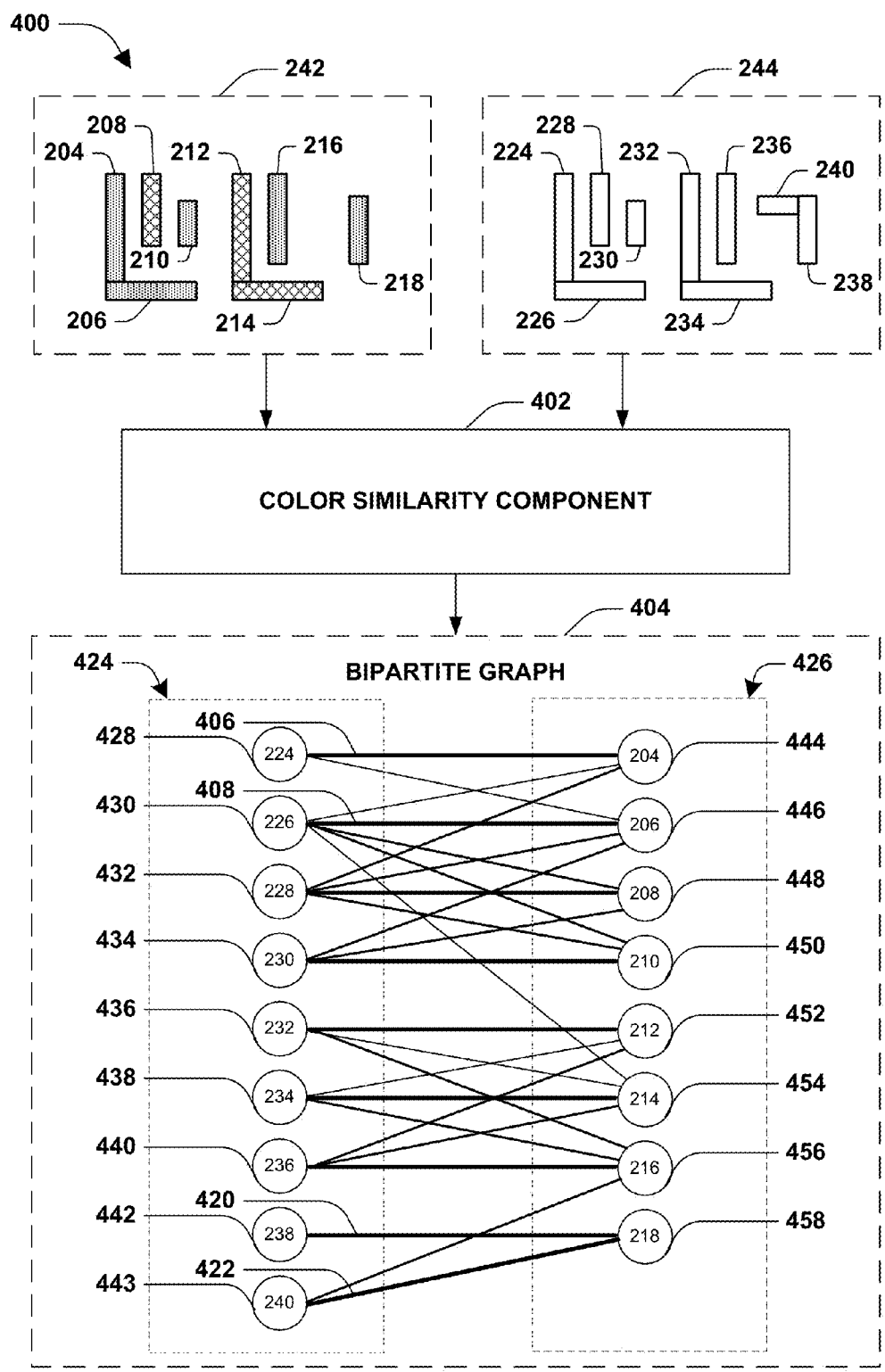
FIG. 4 is an illustration of a system configured for generating a bipartite graph used to define pattern color similarity between an original layout and a new layout, according to some embodiments.

FIG. 4 illustrates a system 400 for generating a bipartite graph 404 used to define pattern color similarity between the original layout 202 and the new layout 222, according to some embodiments. The system 400 comprises a color similarity component 402. The color similarity component 402 is configured to define pattern color similarity between the original layout 202 and the new layout 222 based upon the pattern layout correlation 308 and other factors. The color similarity component 402 is configured to generate the bipartite graph 404 comprising a first set of nodes 424 representing new pattern portions within the new layout 222 and a second set of nodes 426 representing original pattern portions within the original layout 202. For example, the first set of nodes 424 comprises a first node 428 representing the first new pattern portion 224, a second node 430 representing the second new pattern portion 226, a third node 432 representing the third new pattern portion 228, a fourth node 434 representing the fourth new pattern portion 230, a fifth node 436 representing the fifth original new portion 232, a sixth node 438 representing the sixth new pattern portion 234, a seventh node 440 representing the seventh new pattern portion 236, an eighth node 442 representing the eighth new pattern portion 238, and a ninth node 443 representing the ninth new pattern portion 240. The second set of nodes 426 comprises a tenth node 444 representing the first original pattern portion 204, an eleventh node 446 representing the second original pattern portion 206, a twelfth node 448 representing the third original pattern portion 208, a thirteenth node 450 representing the fourth original pattern portion 210, a fourteenth node 452 representing the fifth original pattern portion 212, a fifteenth node 454 representing the sixth original pattern portion 214, a sixteenth node 456 representing the seventh original pattern portion 216, and a seventeenth node 458 representing the eighth original pattern portion 218.

The color similarity component 402 can perform a bipartite matching technique, such as a max bipartite matching technique, to connect nodes from the first set of nodes 424 to nodes within the second set of nodes 426. The color similarity component 402 is configured to create one or more edges between the first set of nodes 424 and the second set of nodes 426 based upon color pattern layout correlation between nodes, as defined by the pattern layout correlation 308. For example, a first edge 406 is created between the first node 428 and the tenth node 444 based upon the first new pattern portion 224 having a relatively high correlation to the first original pattern portion 204. A second edge is created between the first node 428 and the eleventh node 446 based upon a relatively low or moderate correlation between the first new pattern portion 224 and the second original pattern portion 206. In this way, one or more edges are created based upon varying degrees of correlation (e.g., illustrated by thickness of such edges where thicker edges correspond to higher correlations), such as a third edge 408 between the second node 430 and the eleventh node 446, a fourth edge 420 between the eighth node 442 and the seventeenth node 458, a fifth edge 422 between the ninth node 443 and the seventeenth node 458, or other edges.

In some embodiments, the color similarity component 402 defines pattern color similarity as $Sc=\Sigma-Rij \cdot |ci-cj|$ where $Sc$ is pattern color similarity between the original layout 202 and the new layout 222, $c_i$ is a "potential" pattern color for a new pattern portion within the new layout 222, $c_j$ is a pattern color of an original pattern portion within the original layout 202, $R_{ij}$ is pattern layout correlation between the new pattern portion and the original pattern portion, and $c_i-c_j$ is a cost to assign $c_i$ to the new pattern portion such as a cost of 0 where there is no difference in pattern color and a cost greater than 0 where there is a difference in pattern color. In some embodiments, the color similarity component 404 generates a network flow from the bipartite graph 404, as illustrated in FIG. 5.

Figure 5:
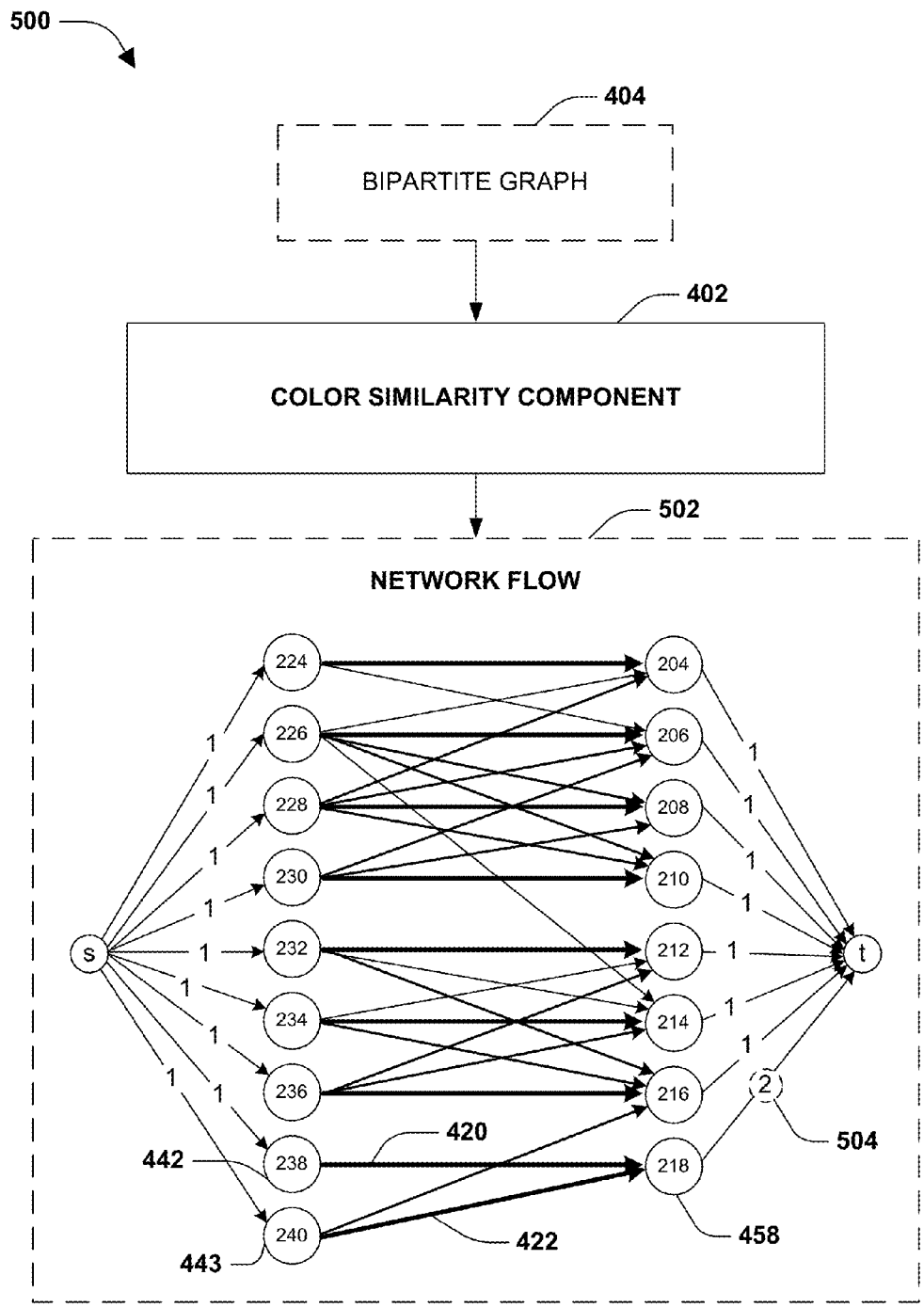
FIG. 5 is an illustration of a system configured for generating a network flow from a bipartite graph, according to some embodiments.

FIG. 5 illustrates a system 500 for generating a network flow 502 from the bipartite graph 404, according to some embodiments. The system 500 comprises the color similarity component 402. The color similarity component 402 is configured to generate the network flow 502 by assigning capacity metrics and cost metrics to edges within the bipartite graph 404 to create the network flow 502. In this way, a network flow technique, such as a max flow technique, is performed to identify pattern colors for assignment to new pattern portions within the new layout 222. A capacity metric can be adjusted where more than one node, representing new pattern portions, are connected (e.g., by edges having relatively high pattern layout correlations) to a node representing an original pattern portion. For example, the seventeenth node 458, representing the eighth original pattern portion 218, is connected to the eighth node 442 representing the eighth new pattern portion 238 by the fourth edge 420, and is connected to the ninth node 443 representing the ninth new pattern portion 240 by the fifth edge 422. In this way, a capacity metric 504 associated with the seventeenth node 458 is adjusted to 2, for example. The network flow 502 can be evaluated to identify pattern colors for assignment to new pattern portions based upon capacity metrics and costs metrics, as illustrated by FIGS. 6A and 6B.

Figure 6A:
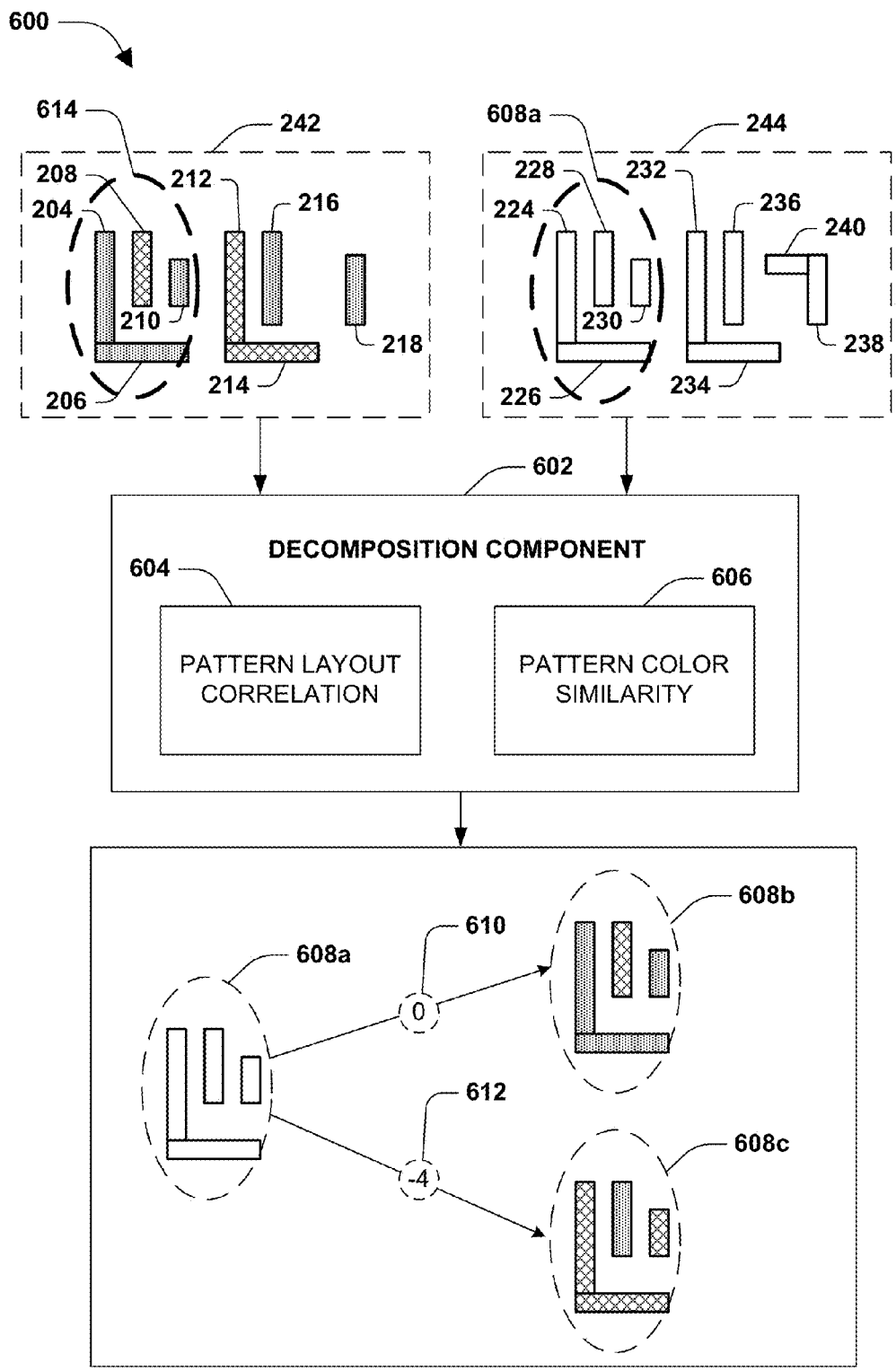
FIG. 6A is an illustration of a system configured for assigning one or more pattern colors to a new layout, according to some embodiments.

FIG. 6A illustrates a system 600 for assigning one or more pattern colors to the new layout 222. The system 600 comprises a decomposition component 602. The decomposition component 602 is configured to assign one or more pattern colors to new pattern portions within the new layout 222 based upon a pattern layout correlation 604 and pattern color similarity 606. In an example, the decomposition component 602 identifies a set of pattern groups within the new layout 222, such as a first pattern group 608a. The decomposition component 602 identifies one or more potential color schemes that could be assigned to the first pattern group 608a, such as a first potential color scheme 608b and a second potential color scheme 608c. The decomposition component 602 assigns a first cost 610, having a relatively low cost of 0, to the first potential color scheme 608b because the first potential color scheme 608a has a relatively high similarity to a color scheme assigned to a corresponding pattern group 614 within the original layout 202. The decomposition component 602 assigns a second cost 612, having a relatively high cost of −4, to the second potential color scheme 608c because the second potential color scheme 608c has a relatively low similarity to the color scheme assigned to the corresponding pattern group 614 (e.g., 4 pattern portions are colored differently). In this way, the decomposition component 602 assigns the first potential color scheme 608b to the first pattern group 608a during decomposition of the new layout 222 based upon the first cost 610 being lower than the second cost 612.

Figure 6B:
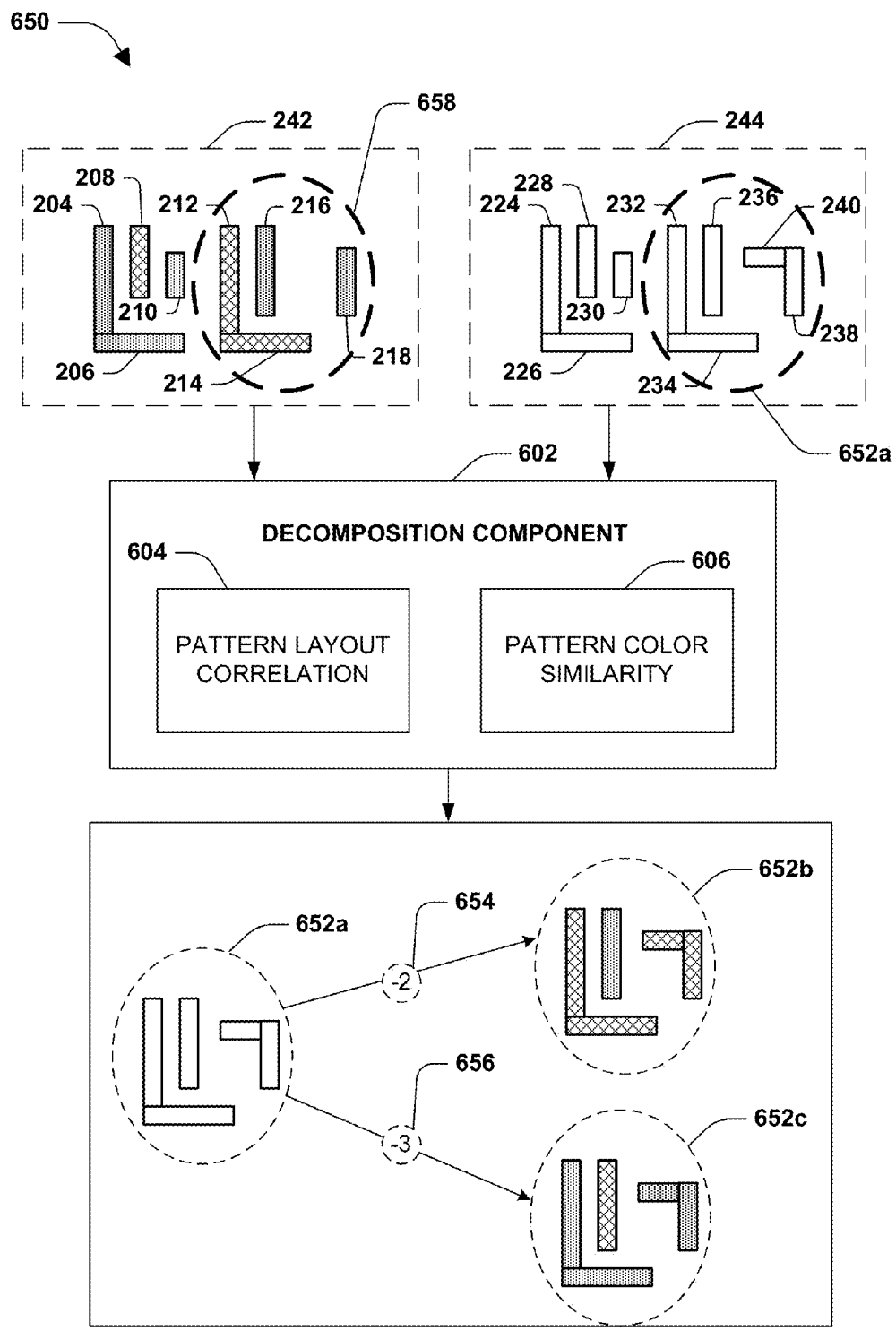
FIG. 6B is an illustration of a system configured for assigning one or more pattern colors to a new layout, according to some embodiments.

FIG. 6B illustrates a system 650 for assigning one or more pattern colors to the new layout 222. The system 650 comprises the decomposition component 602. The decomposition component 602 is configured to assign one or more pattern colors to new pattern portions within the new layout 222 based upon the pattern layout correlation 604 and the pattern color similarity 606. In an example, the decomposition component 602 identifies the set of pattern groups within the new layout 222, such as a second pattern group 652a. The decomposition component 602 identifies one or more potential color schemes that could be assigned to the second pattern group 652a, such as a first potential color scheme 652b and a second potential color scheme 652c. The decomposition component 602 assigns a first cost 654, having a relatively low to moderate cost of −2, to the first potential color scheme 652b because the first potential color scheme 652b has a relatively moderate similarity to a color scheme assigned to a corresponding pattern group 658 within the original layout 202 (e.g., 3 pattern portions have similar colors, and 2 pattern portions are colored differently). The decomposition component 602 assigns a second cost 656, having a moderate to high cost of −3, to the second potential color scheme 652c because the second potential color scheme 652c has a relatively low similarity to the color scheme assigned to the corresponding pattern group 658 (e.g., 3 pattern portions are colored differently). In this way, the decomposition component 602 assigns the first potential color scheme 652b to the first pattern group 652a during decomposition of the new layout 222 based upon the first cost 654 being lower than the second cost 656.

Figure 7:
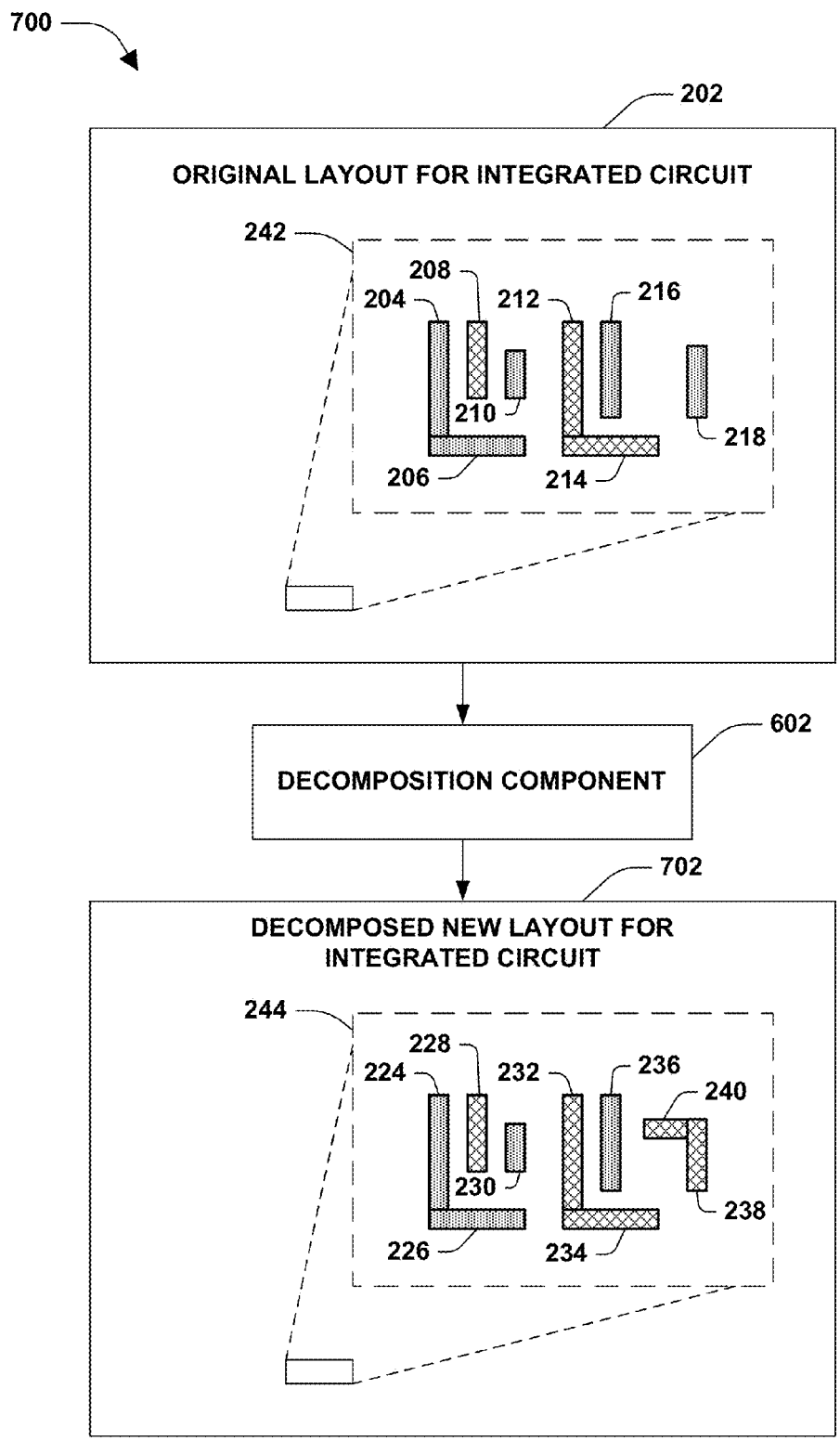
FIG. 7 is an illustration of a system configured for assigning one or more pattern colors to a new layout to create a decomposed new layout for an integrated circuit, according to some embodiments.

FIG. 7 illustrates a system 700 for assigning one or more pattern colors to the new layout 222 to create a decomposed new layout 702 for the integrated circuit. The system 700 comprises the decomposition component 602. The decomposition component 602 is configured to assign one or more patterns to the new layout 222 such that the decomposed new layout 702 has relatively high color similarity with respect to the original layout 202. For example, 7 new pattern portions, such as new pattern portions 224 through 236, are assigned to pattern colors that are similar to pattern colors assigned to corresponding original pattern portions, such as original pattern portions 204 through 216. Merely the eighth new pattern portion 238 is assigned to a different pattern color than an original pattern portion (e.g., original pattern portion 218). In this way, changes to pattern masks associated with the original layout 202 are mitigated due to the relatively high similarity between the original layout 202 and the decomposed new layout 702.

According to an aspect of the instant disclosure, a method for implementing a change order between an original layout and a new layout associated with an integrated circuit is provided. The method comprises, defining a pattern layout correlation between the original layout and the new layout. The new layout corresponds to the change order as applied to the original layout. A pattern color similarity between the original layout and the new layout is defined. One or more pattern colors are assigned to the new layout based upon the pattern layout correlation and the pattern color similarity. In an example, a first pattern color corresponds to a first pattern mask used to fabricate a first portion the integrated circuit. A second pattern color corresponds to a second pattern mask used to fabricate a second portion of the integrated circuit.

According to an aspect of the instant disclosure, a system for implementing a change order between an original layout and a new layout associated with an integrated circuit is provided. The system comprises a pattern correlation component configured to define a pattern layout correlation between the original layout and the new layout. The new layout corresponds to the change order as applied to the original layout. The system comprises a color similarity component configured to generate a bipartite graph comprising a first set of nodes representing new pattern portions within the new layout and a second set of nodes representing original pattern portions within the original layout. A bipartite matching technique is performed upon the bipartite graph to define a pattern color similarity between the original layout and the new layout. The system comprises a decomposition component configured to assign one or more pattern colors to the new layout based upon the pattern layout correlation and the pattern color similarity.

According to an aspect of the instant disclosure, a computer-readable medium comprising instructions that perform a method for implementing a change order between an original layout and a new layout associated with an integrated circuit is provided. The method comprises, defining a pattern layout correlation between the original layout and the new layout. The new layout corresponds to a change order as applied the original layout. A pattern color similarity is defined between the original layout and the new layout. A first pattern color is identified for assignment to a new pattern portion within the new layout based upon the pattern layout correlation and the pattern color similarity. The first pattern color, but not a second pattern color, is assigned to the new pattern portion based upon the assignment of the first pattern color resulting in an increased layout coloring similarity for the new layout with respect to the original layout.

Figure 8:
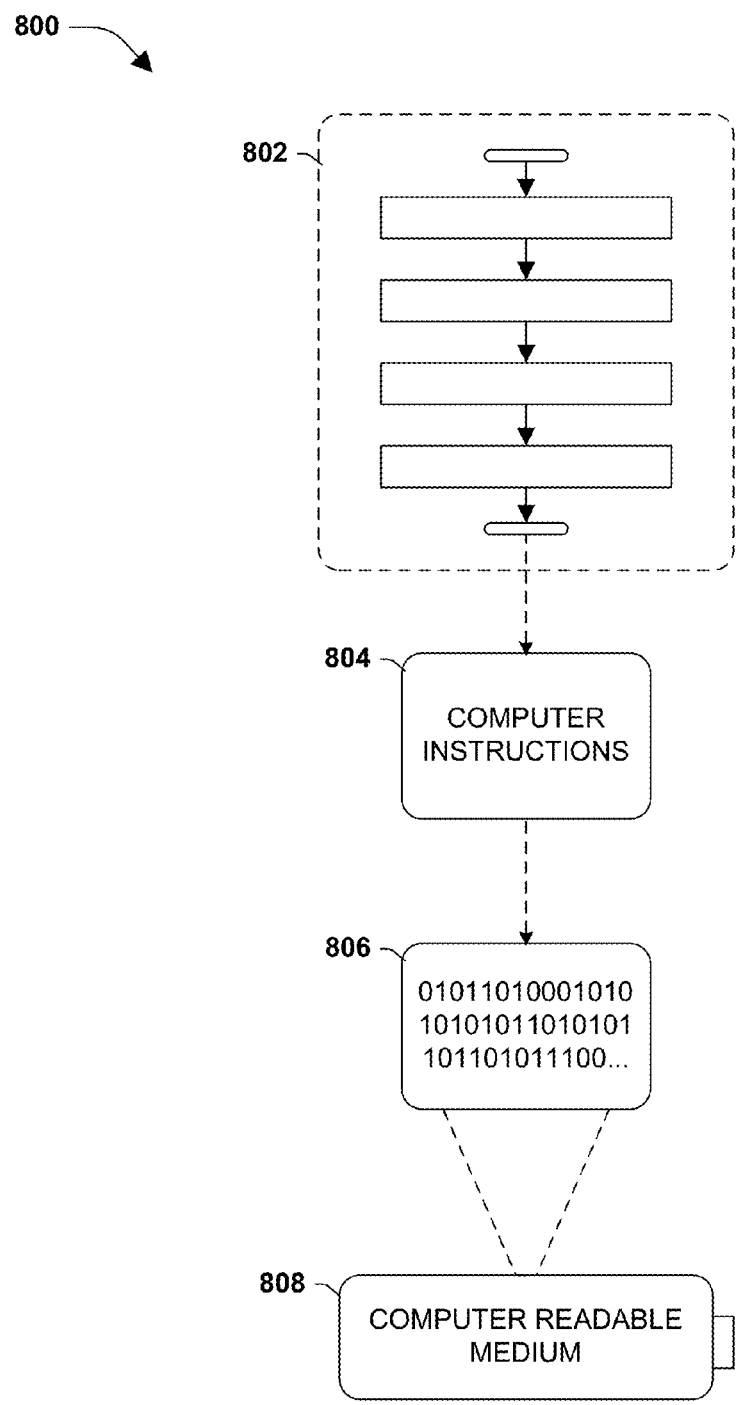
FIG. 8 is an illustration of an example computer-readable medium wherein processor-executable instructions configured to embody one or more of the provisions set forth herein can be comprised.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 8, wherein the implementation 800 comprises a computer-readable medium 808, such as a CD-R, DVD-R, flash drive, a platter of a hard disk drive, etc., on which is encoded computer-readable data 806. This computer-readable data 806, such as binary data comprising at least one of a zero or a one, in turn comprises a set of computer instructions 804 configured to operate according to one or more of the principles set forth herein. In some embodiments, the processor-executable computer instructions 804 are configured to perform a method 802, such as at least some of the exemplary method 100 of FIG. 1, for example. In some embodiments, the processor-executable instructions 804 are configured to implement a system, such as at least some of the exemplary system 300 of FIG. 3, at least some of the exemplary system 400 of FIG. 4, at least some of the exemplary system 500 of FIG. 5, at least some of the exemplary system 600 of FIG. 6A, at least some of the exemplary system 650 of FIG. 6B and/or at least some of the exemplary system 700 of FIG. 7, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component can be, but is not limited to being, a process running on a processor, a processor, an object, an executable, a thread of execution, a program, or a computer. By way of illustration, both an application running on a controller and the controller can be a component. One or more components reside within a process or thread of execution, in some embodiments. A component is localized on one computer or distributed between two or more computers, in some embodiments.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications can be made to this configuration without departing from the scope or spirit of the claimed subject matter.

Figure 9:
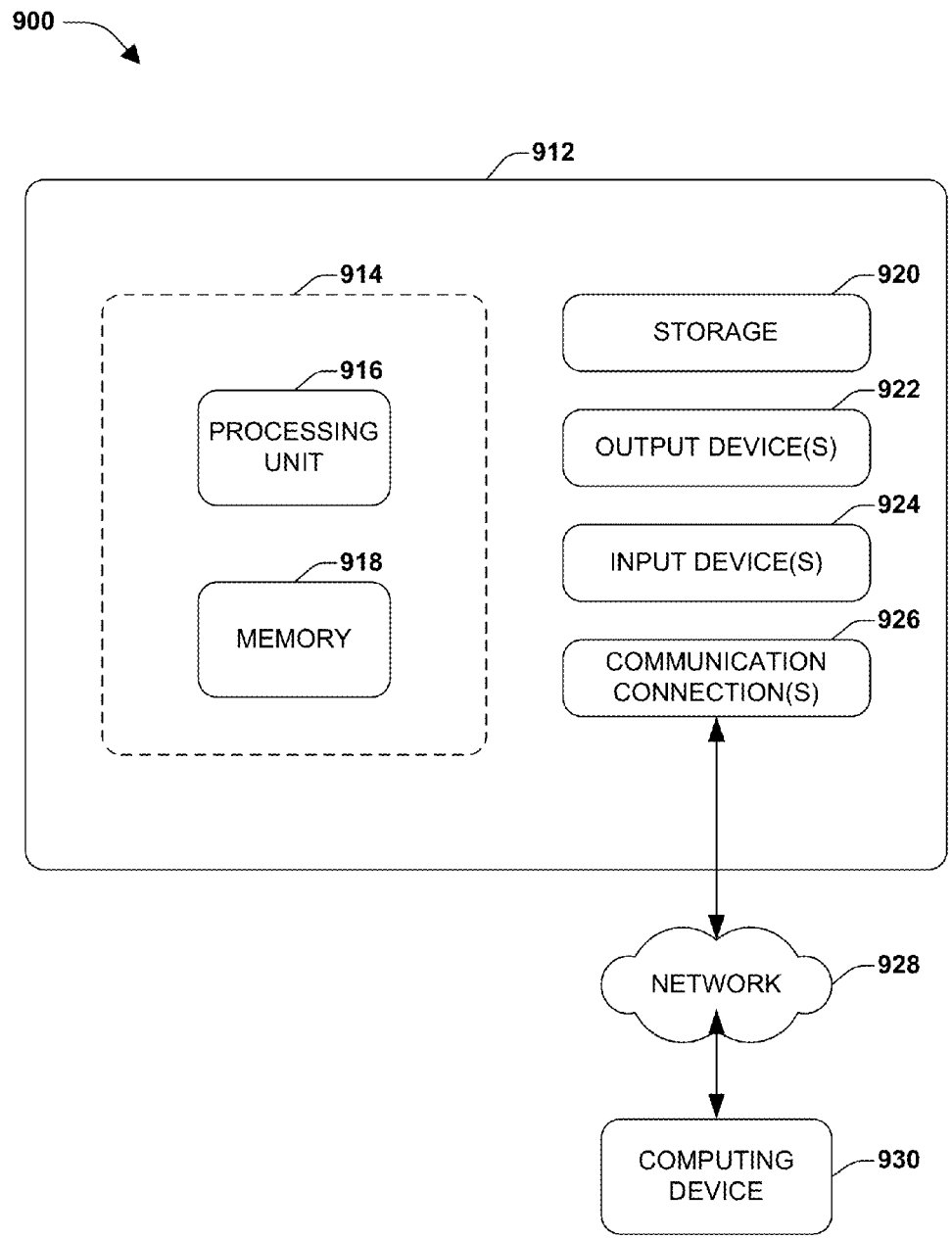
FIG. 9 illustrates an example computing environment wherein one or more of the provisions set forth herein can be implemented.

FIG. 9 and the following discussion provide a brief, general description of a suitable computing environment to implement embodiments of one or more of the provisions set forth herein. The operating environment of FIG. 9 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 9 illustrates an example of a system 900 comprising a computing device 912 configured to implement one or more embodiments provided herein. In one configuration, computing device 912 includes at least one processing unit 916 and memory 918. In some embodiments, depending on the exact configuration and type of computing device, memory 918 is volatile, such as RAM, non-volatile, such as ROM, flash memory, etc., or some combination of the two. This configuration is illustrated in FIG. 9 by dashed line 914.

In other embodiments, device 912 includes additional features or functionality. For example, device 912 also includes additional storage such as removable storage or non-removable storage, including, but not limited to, magnetic storage, optical storage, and the like. Such additional storage is illustrated in FIG. 9 by storage 920. In some embodiments, computer readable instructions to implement one or more embodiments provided herein are in storage 920. Storage 920 also stores other computer readable instructions to implement an operating system, an application program, and the like. Computer readable instructions are loaded in memory 918 for execution by processing unit 916, for example.

The term "computer readable media" as used herein includes computer storage media. Computer storage media includes volatile and nonvolatile, removable and non-removable media implemented in any method or technology for storage of information such as computer readable instructions or other data. Memory 918 and storage 920 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 912. Any such computer storage media is part of device 912.

Device 912 includes communication connection(s) 926, in some embodiments, that allows device 912 to communicate with other devices. Communication connection(s) 926 includes, but is not limited to, a modem, a Network Interface Card (NIC), an integrated network interface, a radio frequency transmitter/receiver, an infrared port, a USB connection, or other interfaces for connecting computing device 912 to other computing devices. Communication connection(s) 926 includes a wired connection or a wireless connection in some embodiments. Communication connection(s) 926 transmits and/or receives communication media in some embodiments.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 912 includes input device(s) 924 such as keyboard, mouse, pen, voice input device, touch input device, infrared cameras, video input devices, or any other input device. Output device(s) 922 such as one or more displays, speakers, printers, or any other output device are also included in device 912. Input device(s) 924 and output device(s) 922 are connected to device 912 via a wired connection, wireless connection, or any combination thereof. In some embodiments, an input device or an output device from another computing device are used as input device(s) 924 or output device(s) 922 for computing device 912. Device 912 also includes communication connection(s) 926 to facilitate communications with one or more other devices.

Components of computing device 912 are connected by various interconnects, such as a bus. Such interconnects include a Peripheral Component Interconnect (PCI), such as PCI Express, a Universal Serial Bus (USB), firewire (IEEE 13104), an optical bus structure, and the like. In another embodiment, components of computing device 912 are interconnected by a network. For example, memory 918 is comprised of multiple physical memory units located in different physical locations interconnected by a network.

Storage devices utilized to store computer readable instructions are distributed across a network in some embodiments. For example, a computing device 930 accessible via a network 928 stores computer readable instructions to implement one or more embodiments provided herein. Computing device 912 accesses computing device 930 and downloads a part or all of the computer readable instructions for execution. Alternatively, computing device 912 downloads pieces of the computer readable instructions, as needed, or some instructions are executed at computing device 912 and some at computing device 930.

Various operations of embodiments are provided herein. The order in which some or all of the operations are described should not be construed as to imply that these operations are necessarily order dependent. Alternative ordering will be appreciated having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure could have been disclosed with respect to only one of several implementations, such feature can be combined with one or more other features of the other implementations as desired and advantageous for any given or particular application.

What is claimed is:

1. A method for layout re-decomposition, comprising:
defining a pattern layout correlation between an original layout and a new layout for an integrated circuit, the new layout corresponding to a change order to the original layout, a pattern area of the new layout different than a pattern area of the original layout, where the pattern area of the new layout corresponds to an amount of area within the new layout occupied by polygons and the pattern area of the original layout corresponds to an amount of area within the original layout occupied by polygons;
defining pattern color similarity between the original layout and the new layout; and
assigning one or more pattern colors to the new layout based upon the pattern layout correlation and the pattern color similarity, a first pattern color corresponding to a first pattern mask and a second pattern color corresponding to a second pattern mask, at least some of the method implemented at least in part via a processing unit.

2. The method of claim 1, the defining a pattern layout correlation comprising:
calculating a first pattern layout correlation based upon an overlapping area factor corresponding to a positional correlation of an original pattern portion within the original layout and a new pattern portion within the new layout.

3. The method of claim 1, the defining a pattern layout correlation comprising:
calculating a first pattern layout correlation based upon a surrounding pattern factor corresponding to a relationship between a projected length and a pattern edge length associated with a first pattern portion.

4. The method of claim 1, the defining a pattern layout correlation comprising:
for respective new pattern portions within the new layout, identifying a current new pattern portion within the new layout as being correlated to a current original pattern portion within the original layout based upon a current pattern layout correlation between the current new pattern portion and the current original pattern portion being greater than a correlation threshold.

5. The method of claim 1, the defining pattern color similarity comprising:
generating a bipartite graph comprising a first set of nodes representing new pattern portions within the new layout and a second set of nodes representing original pattern portions within the original layout; and
performing a bipartite matching technique upon the bipartite graph to define the pattern color similarity.

6. The method of claim 5, the generating a bipartite graph comprising:
connecting a first node within the first set of nodes to one or more nodes within the second set of nodes utilizing one or more edges, a first edge connecting the first node representing a first new pattern portion and a second node representing a first original pattern portion, the first edge comprising a first cost metric, the first cost metric corresponding to a difference in pattern color between the first original pattern portion and the first new pattern portion.

7. The method of claim 6, comprising:
generating a network flow based upon the bipartite graph, the network flow comprising a first capacity metric for the first edge within the bipartite graph, the first capacity metric defining a number of allowed pattern correlations for the first original pattern portion; and
utilizing the network flow to assign the one or more pattern colors to the new layout.

8. The method of claim 7, comprising:
adjusting the first capacity metric based upon the second node being connected to more than one node within the first set of nodes.

9. The method of claim 1, the assigning one or more pattern colors comprising:
assigning the first pattern color, but not the second pattern color, to a first new pattern portion based upon an assignment of the first pattern color resulting in an increased layout coloring similarity for the new layout with respect to the original layout relative to the second pattern color.

10. The method of claim 1, the assigning one or more pattern colors to the new layout comprising:
constructing a conflict graph;
identifying a set of pattern groups within the new layout based upon the conflict graph, a first pattern group comprising one or more pattern portions within a threshold distance of one another; and
for the first pattern group:
assigning a first cost to a first potential color scheme for the first pattern group;
assigning a second cost to a second potential color scheme for the first pattern group; and
selecting the first potential color scheme as an assignment color scheme when the first cost is less than the second cost.

11. The method of claim 1, the new layout corresponding to at least one of a multiple-patterning layout or a self-aligned multiple-patterning layout.

12. The method of claim 1, the new layout corresponding to at least one of a before mask creation layout or an after mask creation layout.

13. The method of claim 7, the utilizing the network flow comprising:
solving the network flow utilizing a max flow approach.

14. A system for layout re-decomposition, comprising:
one or more processing units; and
memory comprising processor-executable instructions that when executed by at least one of the one or more processing units perform a method, comprising:
defining a pattern layout correlation between an original layout and a new layout, the new layout corresponding to a change order to the original layout, a pattern area of the new layout different than a pattern area of the original layout, where the pattern area of the new layout corresponds to an amount of area within the new layout occupied by polygons and the pattern area of the original layout corresponds to an amount of area within the original layout occupied by polygons;
generating a bipartite graph comprising a first set of nodes representing one or more new pattern portions within the new layout and a second set of nodes representing one or more original pattern portions within the original layout; and
performing a bipartite matching technique upon the bipartite graph to define a pattern color similarity between the original layout and the new layout; and
assigning one or more pattern colors to the new layout based upon the pattern layout correlation and the pattern color similarity.

15. The system of claim 14, the defining a pattern layout correlation comprising:
calculating a first pattern layout correlation based upon an overlapping area factor corresponding to a positional correlation of an original pattern portion within the original layout and a new pattern portion within the new layout.

16. The system of claim 14, the defining a pattern layout correlation comprising:
calculating a first pattern layout correlation based upon a surrounding pattern factor corresponding to a relationship between a projected length and a pattern edge length associated with a first pattern portion.

17. The system of claim 14, the generating a bipartite graph comprising:
connecting a first node within the first set of nodes to one or more nodes within the second set of nodes utilizing one or more edges, a first edge connecting the first node representing a first new pattern portion and a second node representing a first original pattern portion, the first edge comprising a first cost metric, the first cost metric corresponding to a difference in pattern color between the first original pattern portion and the first new pattern portion.

18. The system of claim 14, the assigning one or more pattern colors comprising:
assigning a first pattern color of the one or more pattern colors to a first new pattern portion based upon the assignment of the first pattern color resulting in an increased layout coloring similarity for the new layout with respect to the original layout relative to the second pattern color.

19. A non-transitory computer readable medium comprising instructions which when executed at least in part via a processing unit perform a method for layout re-decomposition, comprising:
defining a pattern layout correlation between an original layout and a new layout for an integrated circuit, the new layout corresponding to a change order to the original layout, comprising:
calculating a first pattern layout correlation based upon an overlapping area factor corresponding to a positional correlation of an original pattern portion within the original layout and a new pattern portion within the new layout;
defining pattern color similarity between the original layout and the new layout; and
assigning one or more pattern colors to the new layout based upon the pattern layout correlation and the pattern color similarity, a first pattern color corresponding to a first pattern mask and a second pattern color corresponding to a second pattern mask.

20. The non-transitory computer readable medium of claim 19, the defining a pattern layout correlation comprising:
calculating the first pattern layout correlation based upon a surrounding pattern factor corresponding to a relationship between a projected length and a pattern edge length associated with a first pattern portion.

* * * * *